United States Patent [19]

Turner et al.

[11] Patent Number: 5,509,464

[45] Date of Patent: Apr. 23, 1996

[54] METHOD AND APPARATUS FOR COOLING RECTANGULAR SUBSTRATES

[75] Inventors: Norman Turner, Mountain View; John White, Hayward; Alfred Mak, Union City, all of Calif.

[73] Assignee: Applied Materials, Inc., Santa Clara, Calif.

[21] Appl. No.: 99,878

[22] Filed: Jul. 30, 1993

[51] Int. Cl.[6] .................................................. F28F 7/00
[52] U.S. Cl. ...................... 165/80.2; 165/80.1; 118/52; 118/728; 269/903
[58] Field of Search ................................ 165/80.1, 80.2, 165/80.4, 80.5, 185; 29/25.01, 25.02; 34/239; 118/724, 725, 728; 269/26, 903; 437/248

[56] References Cited

U.S. PATENT DOCUMENTS

| 3,920,233 | 11/1975 | Stuckert | 269/55 |
|---|---|---|---|
| 4,282,924 | 8/1981 | Faretra | 269/903 X |
| 4,457,359 | 7/1984 | Holden | 118/724 X |
| 4,458,746 | 7/1984 | Holden | 165/80.5 |
| 4,535,835 | 8/1985 | Holden | 269/26 X |
| 4,603,466 | 8/1986 | Morley | 165/80.5 X |
| 4,875,434 | 10/1989 | Maejima et al. | 118/52 |
| 4,969,511 | 11/1990 | Person | 165/80.2 X |
| 5,069,156 | 12/1991 | Suzuki | 118/52 |
| 5,172,755 | 12/1992 | Samarov | 165/80.2 X |
| 5,212,394 | 5/1993 | Iwasaki et al. | 437/226 X |

FOREIGN PATENT DOCUMENTS

| 0452779 | 4/1991 | European Pat. Off. . | |
| 462563 | 12/1991 | European Pat. Off. | 118/724 |
| 222221 | 10/1986 | Japan | 118/728 |
| 229948 | 10/1987 | Japan | 118/724 |
| 268147 | 10/1989 | Japan | 269/21 |

*Primary Examiner*—Leonard R. Leo
*Attorney, Agent, or Firm*—Michael A. Glenn

[57] ABSTRACT

A rectangular substrate is cooled while it is processed under vacuum in a reaction chamber on a rectangular cooling pedestal having a cooling surface that has a downwardly curving convex shape. The substrate is clamped to the pedestal such that it conforms with a pedestal cooling surface profile. As a result the number of voids between the substrate surface and the pedestal cooling surface are minimized. This promotes consistent cooling of the substrate across the entire substrate surface when the substrate is processed at high RF power levels, by allowing the substrate to be subjected to high levels of backside cooling medium pressure which efficiently propagates heat across such gap from the substrate to the pedestal.

20 Claims, 5 Drawing Sheets

METHOD AND APPARATUS FOR COOLING RECTANGULAR SUBSTRATES

BACKGROUND OF THE INVENTION

TECHNICAL FIELD

The present invention relates to processing rectangular substrates under vacuum in a reaction chamber. More particularly, the present invention relates to cooling rectangular substrates during processing under vacuum in a reaction chamber.

DESCRIPTION OF THE PRIOR ART

Figure 1:
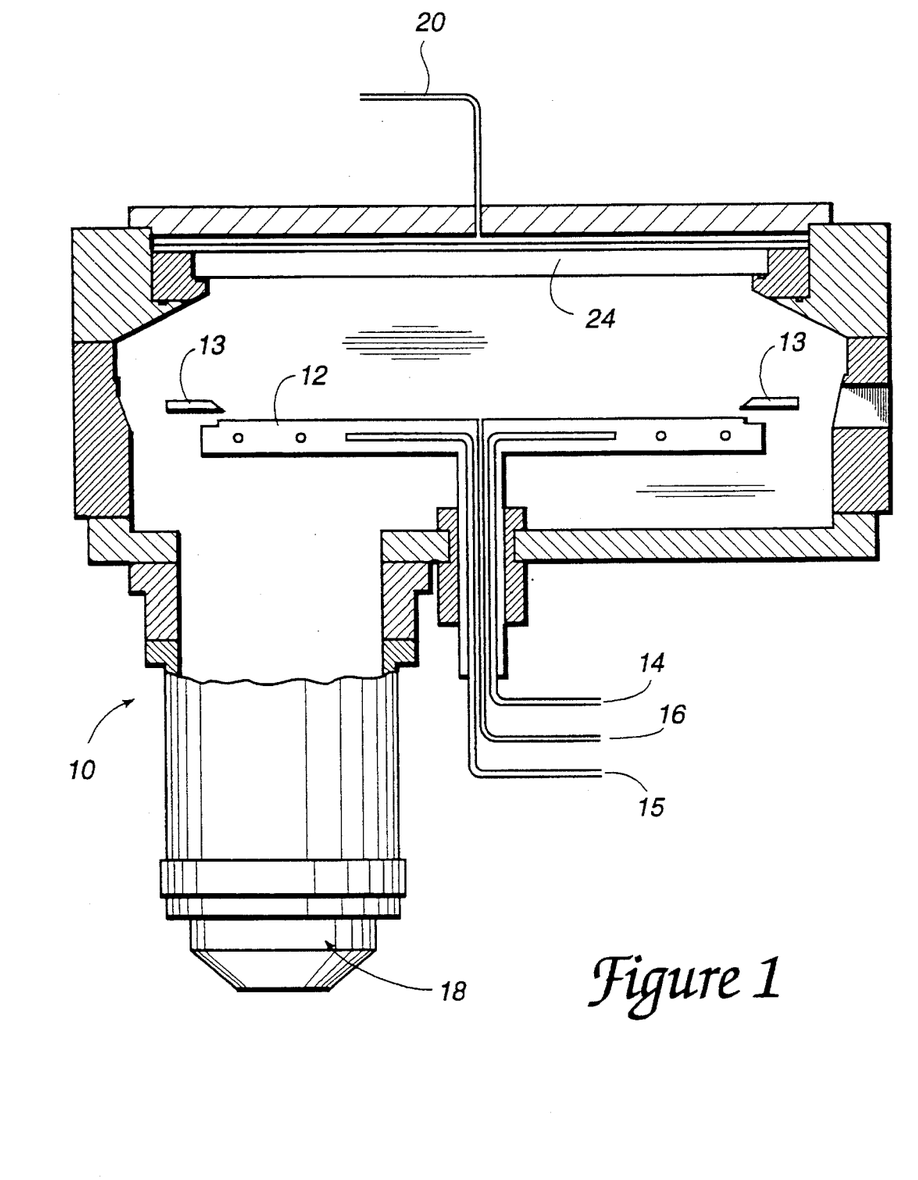
FIG. 1 is a cross sectional schematic diagram of a prior art reaction chamber.

Reaction chambers are well known and useful tools for performing various critical and precision processing steps in the microelectronics and other industries. A typical reaction chamber is shown in FIG. 1. The reaction chamber is maintained under a desired amount of vacuum by a turbopump 18. Reactant gas flows into the chamber 10 through a source 20. An RF generator is coupled to an RF electrode 24, which may be placed within the chamber, and/or to a pedestal 12. The RF signal is used to strike and maintain a plasma within the reaction chamber, which excites the gas and thus dramatically alters the reactivity of the gas.

A disk shaped substrate (not shown in FIG. 1) is placed on the pedestal 12 within the reaction chamber, and is secured or maintained in place relative to the pedestal by an edge clamping ring 13. The pedestal is provided both as a support for the substrate and as a heat sink to draw heat away from the substrate during processing, and is typically made of a thermally conductive metal such as aluminum. While the pedestal absorbs heat from the substrate to cool the substrate, the pedestal is in turn cooled by a fluid coolant, such as water, which is provided to the pedestal via a water inlet 14 and which exits the pedestal at an elevated temperature from an outlet 15.

One problem with the above arrangement is that, on a microscopic scale, there is actually very little thermal conductive contact area between the surface of the pedestal and that of the substrate. This may be due to lack of precision manufacture in the surface of the pedestal or a lack of microscopic planarity in the surface of the substrate, among others. Such microscopic mismatch results in a vastly greater amount of void between the pedestal and the substrate than actual contact area. This reduced contact between the pedestal and the substrate thus decreases the rate of thermal transfer from the substrate to the pedestal.

When processing a substrate, it is desirable to perform each processing step as quickly as possible to increase manufacturing throughput and productivity. However, it is also important to cool the substrate during such processing to prevent the substrate structures and deposits formed thereon from being damaged by excessive heating. For example, when etching a pattern into a substrate, high RF power levels must be used to etch quickly. However, such high RF power levels heat the photoresist material that is used to mask the substrate being etched. When photoresist material is subjected to excessive heating, the material may become reticulated, i.e. the material distorts and shrivels, and it then no longer masks the desired substrate surface pattern.

It is known to provide a static pressure of an inert coolant fluid to the backside (the side contacting the pedestal) of the substrate (for example, through a coolant inlet 16). The coolant, by filling in the voids between the substrate and the pedestal, acts as a thermal conduction medium through which heat is moved from the substrate to the pedestal across such voids. To be effective, the coolant fluid must be applied under pressure and this tends to lift the substrate from the surface of the pedestal a slight amount. The substrate is otherwise held in place by the clamping ring.

For disk shaped substrates, such as semiconductor wafers, it is known to provide a dome shaped pedestal. When a substrate is clamped thereon, such a pedestal profile compensates for substrate distortion that is due to the backside pressure applied to the substrate by a coolant fluid. A spherical or at least circularly symmetrically domed pedestal geometry has been found to promote a more intimate and consistent contact between the substrate and the pedestal across the substrate surface. When properly designed, this relation between the pedestal and the substrate minimizes any gaps or voids between the substrate and pedestal surfaces, and thereby promotes even cooling across the entire surface of the substrate.

It is also known to cool disk shaped substrates in a centrifugal chuck. Such a device receives a heated disk on a pedestal portion of an arm assembly. The entire assembly is spun at a high speed, thereby forcing the disk shaped substrate into intimate contact with the pedestal, and thermal transfer (cooling) is accomplished. One advantage of this technique is that it dispenses with the need to use a coolant medium. However, the mechanism needed to spin the substrates at high speed is bulky, complicated, and expensive, and it does not maintain the substrate in a configuration that is useful for many desired applications.

It is desirable in the manufacture of many items to use a substrate having a shape other than that of the familiar disk shaped semiconductor wafer that is used to fabricate semiconductor devices. For example, a rectangular substrate made of glass may be used in the manufacture of flat-panel video displays. While it is known to cool a disk shaped substrate during processing in a reaction chamber, as discussed above, the processing of rectangular substrates, for example etching a rectangular glass panel, has proven troublesome.

Figure 2A:
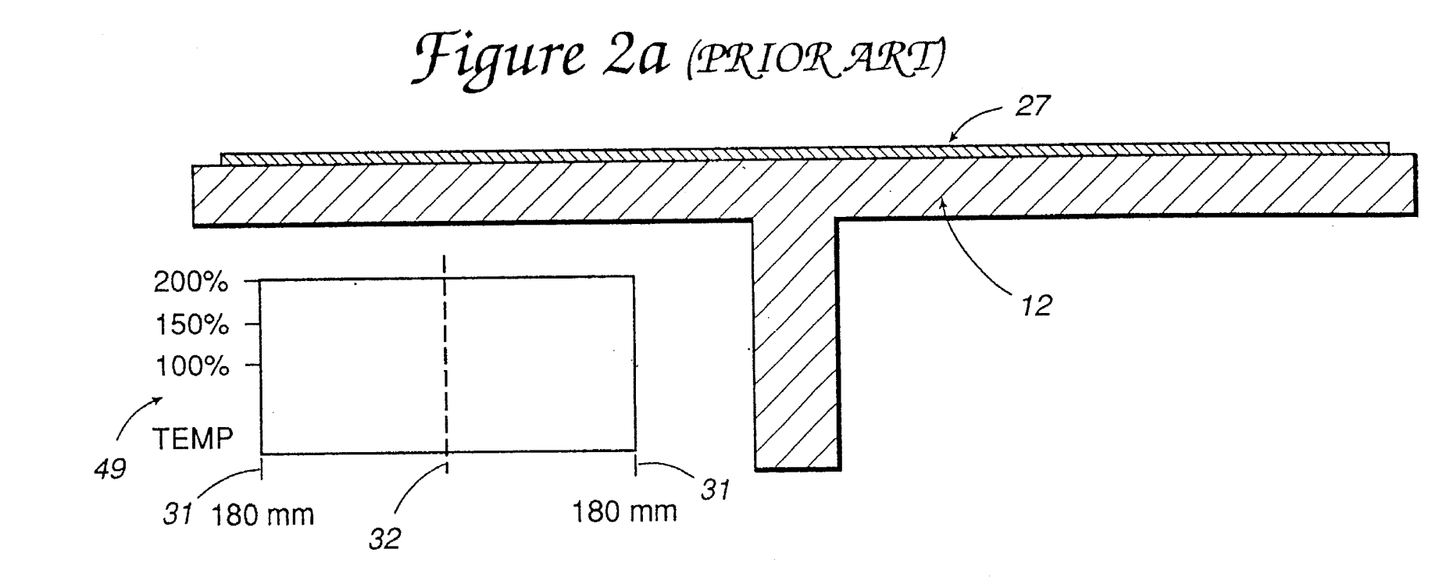
FIG. 2a is a cross sectional schematic diagram showing a prior art pedestal and substrate.

FIG. 2a is a cross sectional schematic diagram of a known flat pedestal. As can be seen from the figure, a substrate 27 is supported by and proximate to a pedestal 12. A cooling profile 49 plots substrate temperature versus surface position for a 360 mm wide substrate. The profile 49 shows relative substrate temperature across the substrate surface from the substrate center 32 to the substrate edges 31.

The cooling profile of FIG. 2a illustrates a serious problem in the art of cooling a rectangular substrate. That is, at the reduced pressures necessary for plasma (dry) etch processing, the substrate temperature can be excessive and unacceptably high if high RF power density is used to achieve a commercially acceptable etching rate. Even though the pedestal 12 may be adequately, actively cooled, the substrate 27 temperature can still be too high as a result of a relatively poor thermal contact of the substrate to the pedestal which results from the fact that neither the substrate nor the pedestal surface is perfectly flat and smooth. Therefore, there is always very little actual physical contact between the pedestal surface and the substrate, and thus a minimal amount of heat conduction area.

Figure 2B:
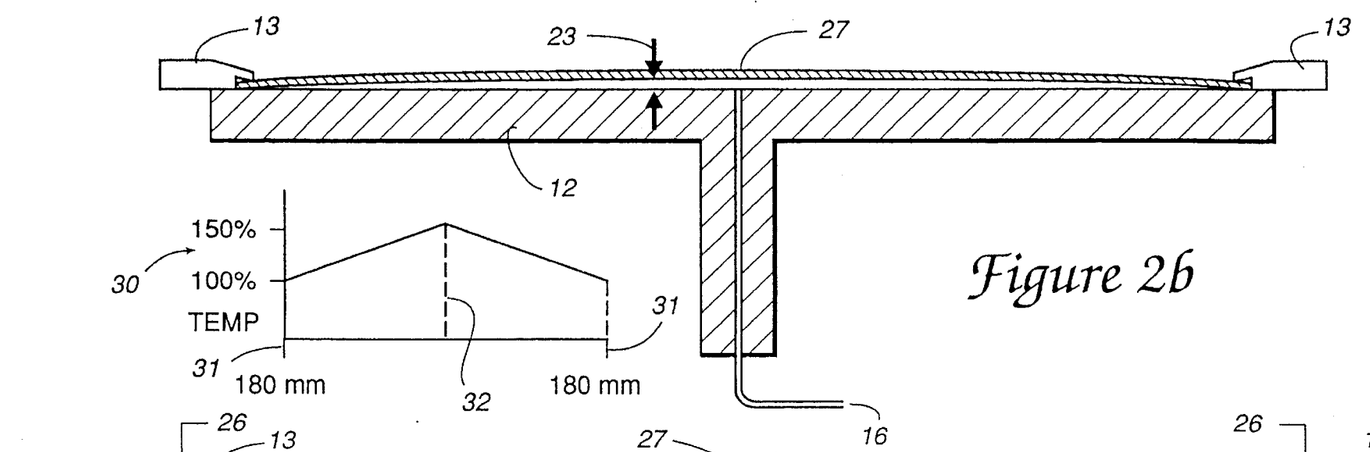
FIG. 2b is a cross sectional schematic diagram showing a partial but still unacceptable solution to the problem of cooling a rectangular substrate.

As a solution to this problem, as shown in FIG. 2b, it would be possible to use a clamp 13 to secure the substrate at a substrate edge, and introduce a gas at a somewhat elevated pressure behind the substrate, that is, between the substrate and the pedestal 12 through a conduit 16. Such an approach would provide a heat conducting medium and thereby improve the thermal contact from the substrate to the cooled pedestal. The net effect, however, would be unacceptable. At the center of the substrate, which is raised or lifted from the pedestal by the force of backside pressure from the coolant medium, a gap 23 between the pedestal and the substrate would result which would require that heat be propagated across a greater distance through the coolant medium at the substrate center than at the edges of the substrate.

As the thermal conductivity of the coolant medium is less than that of the pedestal, that portion of the substrate which is farthest from the pedestal would cool more slowly than that portion of the substrate which is closest to the pedestal. Thus, the profile 30 shows a significantly elevated temperature at the center of the substrate and a lower temperature at the edges of the substrate. It is not possible to avoid this difference in substrate elevation by additional clamping at the substrate center because the entire substrate, except for the edges, must be exposed to the processing environment within the reaction chamber.

It would be possible to use the prior art spherical domed pedestal to reduce the variation in the gap 23 across the rectangular substrate 27. However, the clamping ring 26 needs to be rectangular and thus would need to be machined into a complex vertical geometry. More importantly, the rectangular clamping ring and the rectangular area of the backside gas destroy the spherical symmetry and causes a complex stress distribution in the substrate so that the gap varies both radially and circumferentially.

It would be useful to process a rectangular substrate under vacuum in a reaction chamber at high RF energy levels without increasing the deleterious effects of exposing the substrate to high temperatures and/or temperature gradients. However, there is heretofore no known way of providing efficient cooling of a rectangular substrate under such conditions.

SUMMARY OF THE INVENTION

The present invention is a method and apparatus for cooling a rectangular substrate during processing under vacuum in a reaction chamber. The preferred embodiment of the invention provides a rectangular pedestal having a convex cooling surface with a downwardly curving slope on either side of a surface center line. The center line of the pedestal surface extends along the length of the substrate. The invention provides a smoothly curving convex surface which otherwise approximates the natural parabolic shape that the substrate tends to take when it is subjected to a pressure from one side while the edges of the substrate opposite side are clamped. More generally, the invention involves circular, ellipsoidal, paraboloidal, and other non-circularly symmetric convex surfaces of a pedestal. In addition, the smoothly curving convex shape can be approximated by a multiplicity of small bevels or steps if the departure from the truly smooth continuous surface is kept to less than 10 mils (0.010 inches) and the resulting compromise to the cooling efficiency can be tolerated.

When clamped to the pedestal, the substrate is pressed into conformance with the profile of the pedestal cooling surface. Designing the curvature of the pedestal such that the substrate is deformed slightly more than the theoretical minimum compensates for imperfections in the substrate and the pedestal. The substrate is thus maintained in conforming proximate contact with the pedestal cooling surface even while under the influence of a backside pressure attendant with the supply of a cooling fluid to the substrate. In this way, voids between the substrate and the pedestal may be minimized, and relatively high backside pressures may be used to fill such voids, thereby increasing thermal transfer rates from the substrate, across the voids, to the pedestal. As a result, the present invention allows the use of higher RF energy levels while assuring consistent cooling across the entire surface of the rectangular substrate.

DETAILED DESCRIPTION OF THE INVENTION

The present invention provides a method and apparatus for cooling rectangular and other non-circular substrates during substrate processing under vacuum in a reaction chamber. Such substrate cooling is effected in a consistent manner across the entire surface of the substrate, thereby avoiding temperature gradients which result in hot and cool spots on the substrate surface that could affect reproducibility and process yield.

The present invention minimizes the effect of the microscopic mismatch between the cooling surface of a water cooled pedestal and the backside surface of a heated rectangular substrate which is due to slight irregularities in the flatness and smoothness of each of the two surfaces. A coolant medium at the substrate backside, such as an inert fluid, e.g. helium, acts to fill the voids created by the irregularities in the two surfaces and thereby provide a means for improving heat conduction from the substrate to the cooled pedestal.

In one embodiment of the present invention, a rectangular substrate is held in conformance with a pedestal cooling surface that is profiled such that the pedestal profile matches that of the substrate when the substrate is prestressed by clamping the substrate to the pedestal with a clamping ring. Thus, gaps are not allowed to form between the substrate and the pedestal when a pressurized coolant medium is introduced. Accordingly, it is no longer necessary to transfer heat across a relatively uneven gap and thermally inefficient cooling medium. Thus, the present invention makes it possible to use relatively high RF energy levels for processing. For example, it has been found that with the present invention power levels of 1.5 watts/cm$^2$ or more may be used on glass substrates.

Figure 3:
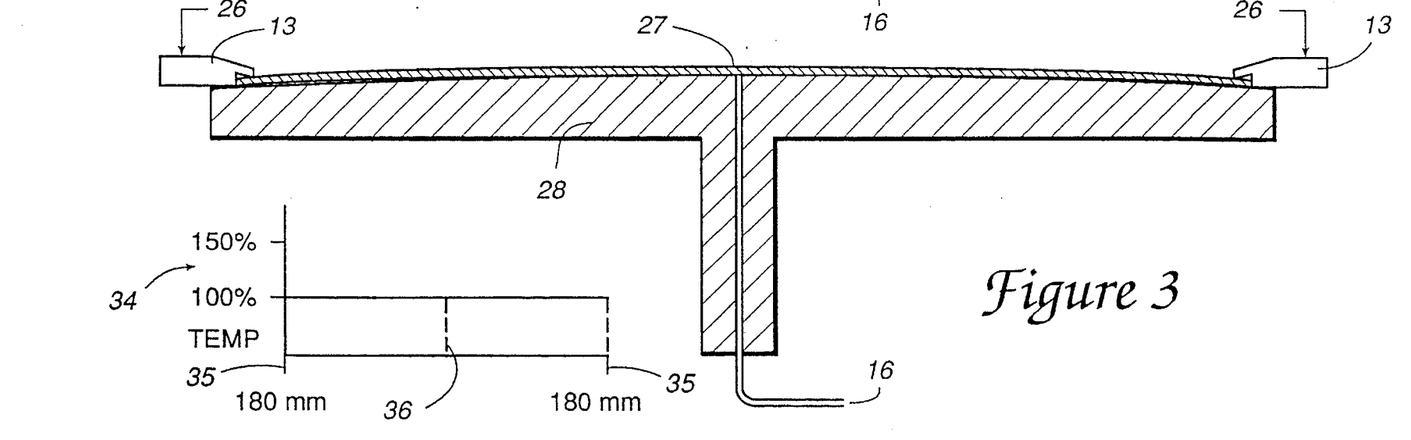
FIG. 3 is a cross sectional schematic diagram showing a pedestal and substrate according to the present invention.

FIG. 3 is a cross sectional schematic diagram showing the relationship between a pedestal and substrate according to the present invention. In the figure, a substrate 27 is positioned proximate to a rectangular pedestal 28. The pedestal has a cooling surface that curves downwardly on either side of a cooling surface center line (not shown). In this embodiment of the invention, the downward slope of the pedestal may be a parabolic, hyperbolic, quadratic, or cylindrical (circular) function, or any combination of such functions. In addition, the smoothly curving convex shape can be approximated by a multiplicity of small bevels or steps, which somewhat compromises the pedestal cooling efficency, but can be tolerated if the departure from the truely smooth continuous surface is kept to less than 10 mils (0.010 inches).

A coolant medium is supplied under pressure to the backside of the substrate through a conduit 16. The substrate 27 is secured in place against the backside pressure of the coolant medium by one or more edge clamps 13. A clamping force, indicated by arrows 26, is applied such that the clamp is able to resist the upward force of the substrate as the substrate tends to be lifted from the pedestal by the pressure of the coolant medium. The clamp thereby maintains the substrate 27 in a desired position proximate to the pedestal 28.

The cooling profile 34 shows a substrate temperature that is uniform from the center 36 of the substrate to the substrate edges 35. In this way, maximum RF energy and/or heating may be used during substrate processing because:

(1) the entire substrate surface is uniformly and consistently positioned proximate to the thermally efficient pedestal, even under conditions of relatively high backside pressure attendant with the supply of a coolant medium; and (2) the number of voids between the substrate and the pedestal through which the coolant fluid is distributed may be minimized subject only to the degree of the surface irregularities of the substrate and the pedestal.

Thus, uniform, low substrate temperature is possible at high RF energy levels because the present invention provides maximum transfer of heat from the substrate.

Figure 4:
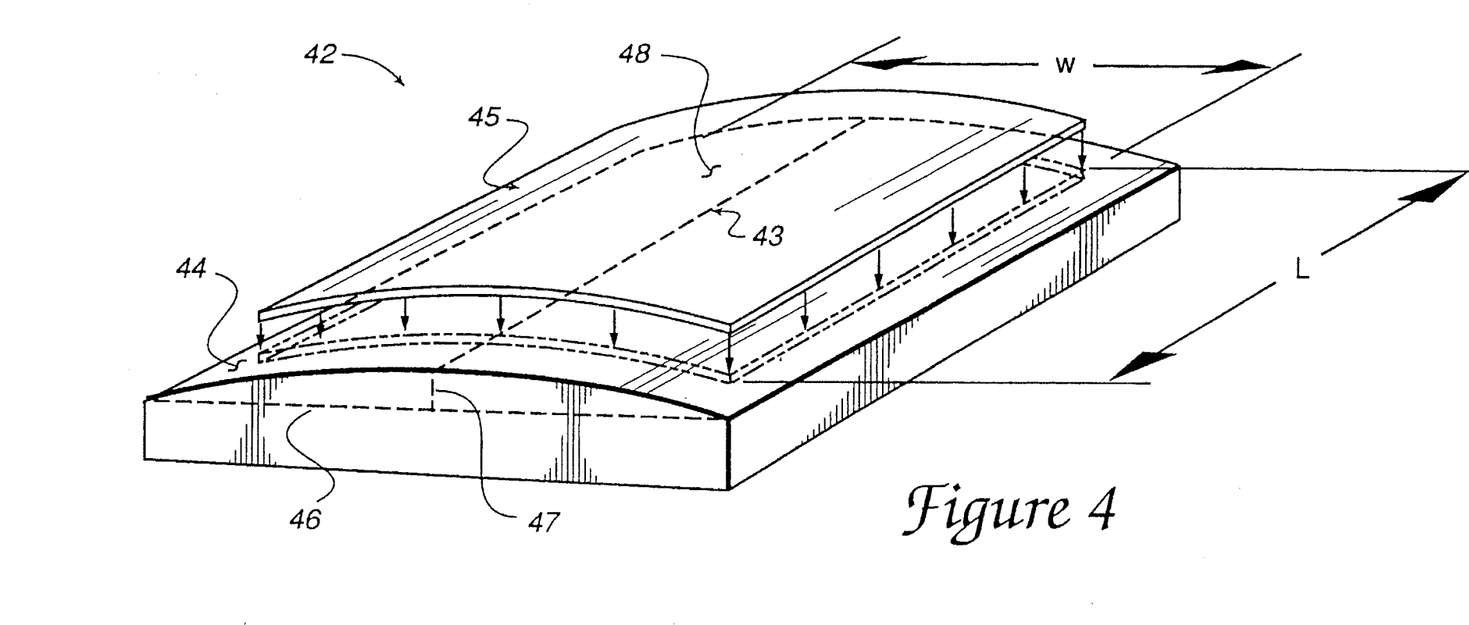
FIG. 4 is a perspective schematic diagram showing a preferred embodiment of the present invention.

It is significant to note that, unlike known techniques for cooling a substrate during processing in a reaction chamber, the present invention is particularly adapted for cooling a rectangular substrate. FIG. 4 is a perspective schematic representation that shows a particularly preferred embodiment of the present invention.

In FIG. 4, a rectangular pedestal 42 has a generally downwardly sloping convex shape which is a function of the pedestal cooling surface altitude 47 and the pedestal width 46 (see formula (1) below). The pedestal 42 is shown with a dashed line 43 dividing the surface into halves. The convex pedestal cooling surface curves downwardly on either side of the center line 43. In actual practice, the curve may be a continuous curve (i.e. smooth) or it may be a series of very small steps that approximate a smoothly curving surface. Additionally, the curve may be derived from any one or combination of geometric functions, based on the elastic properties of the substrate, etc.

A rectangular substrate 48, having a length "l" and a width "w" is positioned proximate to the pedestal cooling surface 44 and conformed to the profile of the cooling surface, for example by clamping, as indicated by the arrows 45 along each edge of the substrate. It should be appreciated that the arrows are intended to indicate a preferred clamping arrangement. Although actual clamping can be modified to approximate continuous edge clamping by those skilled in the art.

In this preferred embodiment of the invention, the substrate is positioned relative to the pedestal cooling surface with the longer substrate dimension running parallel to the pedestal surface center line, and with the shorter substrate dimension being that which is bent when the substrate is conformed to the pedestal surface. This arrangement is preferred because it minimizes the pedestal cooling surface elevation, and thereby minimizes electrode spacing variations over the surface of the substrate, which makes design and alignment of a reaction chamber electrode less critical. When using glass as a substrate the amount of bending is limited by this approach. By using the shorter substrate dimension for bending the likelihood of breaking the substrate is reduced because less bending is necessary. However, it may be desirable in some applications to bend the substrate in the longer substrate dimension. Accordingly, such arrangement is also considered to be part of the present invention.

In practicing the present invention, the amount of curvature of the pedestal surface should be slightly greater than the amount of substrate bending which would result from the amount of pressure which is to be applied by the cooling medium on the back side. In this way, the likelihood that a substrate might (due to normal variations in properties of the substrate, fabrication tolerances of the pedestal, normal variations in coolant medium pressure control, etc.) occasionally bulge away from the pedestal is eliminated. Accordingly, a consistent and intimate relation may be maintained between the substrate and the pedestal.

The required minimum height of the cylindrical surface at its point of maximum elevation may be determined as follows:

$$Y = \alpha \frac{wb^4}{Et^3} \quad (1)$$

where:

"Y" is the height at the center of the pedestal;

"$\alpha$" is a constant derived from the relationship between the length and width of the rectangular substrate;

"w" is a uniform pressure load on the substrate, and is the gas pressure of the cooling medium for a low-pressure reaction chamber;

"b" is the width (bent side) of the substrate;

"E" is the elastic modulus of the substrate material; and

"t" is the thickness of the substrate.

Figure 5:
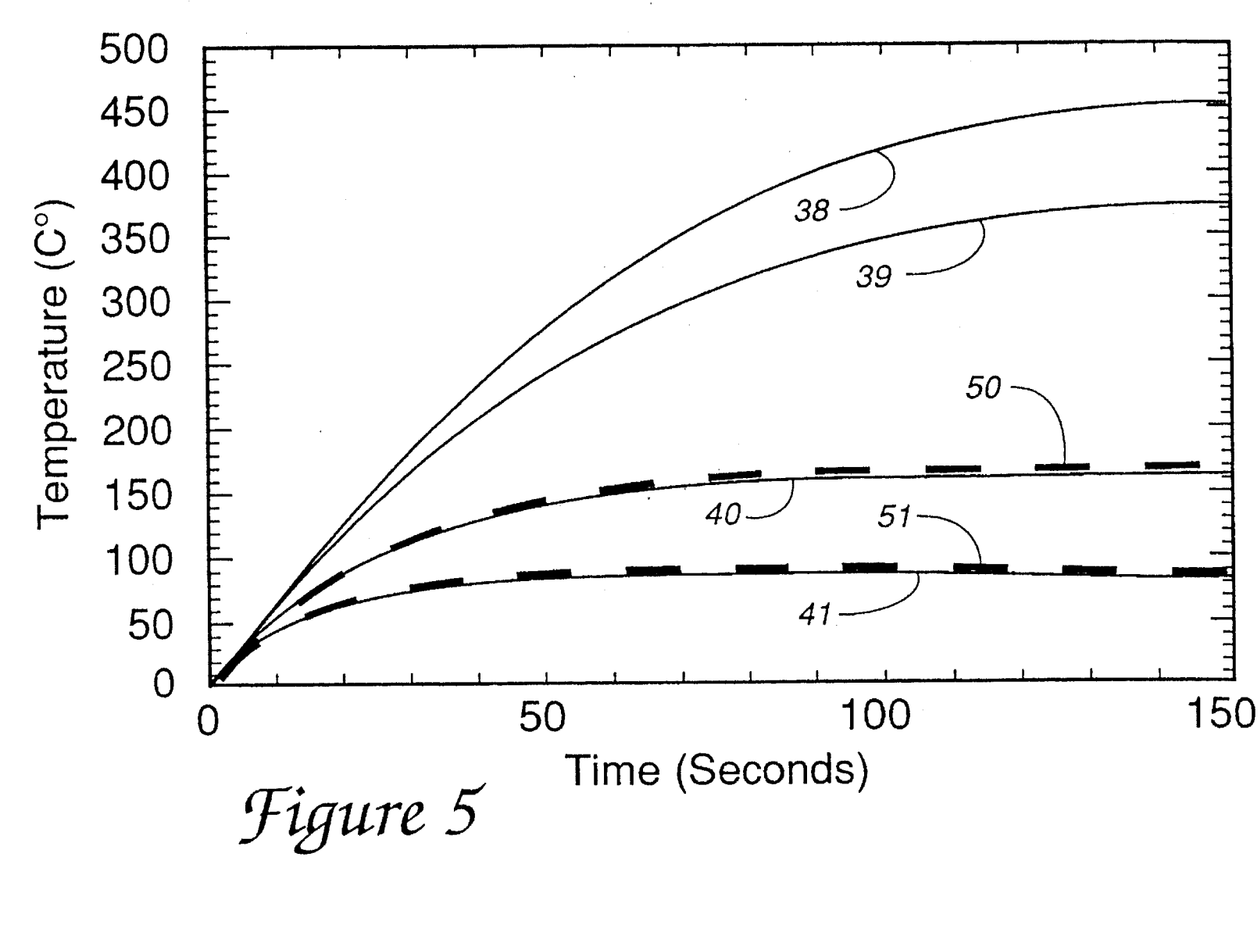
FIG. 5 is a graph plotting four Examples of substrate heating during etching versus backside coolant pressure.

FIG. 5 is a graph plotting four calculated examples of substrate heating during etching versus backside coolant pressure. In each example, a glass substrate is maintained in a proximate position to a water cooled pedestal in accordance with the teachings of the present invention. That is, the substrate is conformed to a convex, downwardly sloping, non-circular pedestal cooling surface. The backside coolant fluid is an inert gas, which, in the following examples, is helium. The following conditions apply with regard to all four examples below:

| | |
|---|---|
| Emissivity of the chuck | 0.5 |
| Emissivity of the plate | 0.92 |
| Accommodation coefficient of helium | 0.5 |
| Initial temperature of the glass | 0° C. |
| Chuck temperature | 0° C. |
| Specific heat of the glass | 795 J/kg-K |
| Density of the glass | 2.76 gm/cc |
| Thickness of the glass | 1.1 mm |
| Modulus of elasticity of the glass | $9.8 \times 10^6$ PSI |
| Rate of heating | 1.5 W/cm$^2$ |

EXAMPLE 1

Helium at a pressure of 0.01 Torr is applied to the backside of a rectangular glass substrate. An average gap of 25 microns is assumed to exist between the substrate and the pedestal. A resulting cooling curve 38 is shown on FIG. 5, in which substrate cooling is relatively inefficient (that is, substrate temperature over time rises to about 450° C.).

EXAMPLE 2

Helium at a pressure of 0.2 Torr is applied to the backside of a rectangular glass substrate. An average gap of 25 microns is assumed to exist between the substrate and the pedestal. A resulting cooling curve 39 is shown on FIG. 5 in which substrate cooling is improved over that of Example 1 (that is, substrate temperature over time rises to about 375° C., versus 450° C. for Example 1). This improvement in substrate cooling is attributed to the increased coolant medium pressure, and the corresponding ability of the coolant medium to propagate more thermal energy from the substrate to the pedestal.

EXAMPLE 3

Helium at a pressure of 1.0 Torr is applied to the backside of a rectangular glass substrate. An average gap of 25 microns is assumed to exist between the substrate and the pedestal. A resulting cooling curve 40 is shown on FIG. 5, in which substrate cooling is still improved over that of examples 1 and 2 (that is, substrate temperature over time only rises to about 150° C). The dashed line 50 represents the same conditions, except that an average gap of 100 microns is assumed to exist. It can be seen from this example that increasing the backside coolant medium pressure, even if the gap between the substrate and the pedestal assumed is increased, provides effective cooling of the substrate.

EXAMPLE 4

Helium at a pressure of 2.0 Torr is applied to the backside of a rectangular glass substrate. An average gap of 25 microns is maintained between the substrate and the pedestal. A resulting cooling curve 41 is shown on FIG. 5, in which still improved substrate cooling is obtained (that is, substrate temperature over time rises only to about 75° C.). The dashed line 51 again represents effective cooling even assuming a 100 micron gap between the substrate and the pedestal.

The foregoing examples illustrate an important feature of the present invention. That is, by fixing a constant minimum gap (void) relationship between the surfaces of the substrate and the pedestal in which the substrate is conformed to a pedestal cooling surface profile, one may increase the backside pressure of a coolant medium and thereby appreciably increase the cooling rate.

Thus, the present invention allows the application of increased backside coolant medium pressure to a rectangular substrate by maintaining the substrate in a conforming profile with that of the pedestal, and also compensates for variations across the substrate surface and imperfections in the pedestal surface. In this way, a maximum amount of heat is transferred from the substrate to the pedestal, and a consistent temperature across the entire surface of the substrate is assured, eliminating hot spots (or cool spots) across the substrate surface. Additionally, substrate and pedestal manufacturing tolerance may be relaxed somewhat to reduce manufacturing costs while still maintaining a high rate of thermal transfer from the substrate to the pedestal.

Although the invention is described herein with reference to the preferred embodiment, one skilled in the art will readily appreciate that other applications may be substituted for those set forth herein without departing from the spirit and scope of the present invention. For example, it should be appreciated by those skilled in the art that the substrate need not be limited to glass, but it may be any material suitable for processing in a reaction chamber, such as silicon, GaAs, various polymers, etc.

Additionally, the reaction chamber and coolant medium may be of any known type, and the pedestal need not be a water cooled aluminum pedestal, but may also be of any known type. The specific pedestal arrangements shown in the Figs. are provided by way of illustration and example only. Thus, the actual profile of the pedestal may be selected based on ease and cost of various machining/fabrication methods that might be employed, as well as on the properties of the substrate to be processed (e.g. modulus of elasticity, etc.), and the shape of the substrate (e.g. a square, a narrow rectangle, etc.). Thus, the pedestal may be sloped to provide an ellipsoidal, paraboloidal, and other non-circularly symmetric convex surface. Accordingly, the invention should only be limited by the claims included below.

We claim:

1. A method for cooling a rectangular glass substrate, comprising the steps of:

positioning said substrate with a substrate surface proximate to a rectangular pedestal having a convex cooling surface, said convex pedestal cooling surface curving downwardly from a pedestal center line; and conforming said substrate to said cooling surface while providing a coolant medium under pressure between said substrate surface and said pedestal surface;

wherein said pedestal cooling surface has a downward curvature that is greater than the amount of substrate bending which would result from the amount of pressure which is to be applied by said coolant medium on said substrate surface; and wherein said downward curvature is sufficient to bend said substrate, such that said substrate surface is brought into an intimate conforming relationship with said pedestal surface, and such that voids between said substrate surface and said cooling surface are minimized.

2. The method of claim 1, wherein said substrate is a glass substrate.

3. The method of claim 1, wherein said downwardly curved pedestal surface is a multiply stepped or beveled slope that sufficiently approximates a smoothly curving surface.

4. The method of claim 3, wherein said multiply stepped or beveled slope has a departure from a smoothly curving surface that is less than 10 mils (0.010 inches).

5. The method of claim 1, wherein said substrate is cooled during processing under vacuum in a reaction chamber.

6. The method of claim 1, wherein said rectangular substrate has a longer dimension and a shorter dimension, and wherein said longer dimension runs either parallel to said cooling surface center line or perpendicular to said center line.

7. The method of claim 1, wherein said coolant medium is an inert gas.

8. An apparatus for cooling a rectangular substrate, comprising:

a rectangular pedestal having a convex cooling surface having a pedestal center line, said convex pedestal cooling surface curving downwardly from said pedestal center line;

means for positioning said substrate at a substrate surface proximate to said cooling surface thereby conforming said substrate to said cooling surface; and a coolant medium provided under pressure to said substrate surface;

wherein said pedestal cooling surface has a downward curvature that is greater than the amount of substrate bending which would result from the amount of pressure which is to be applied by said coolant medium on said substrate surface; and wherein said downward curvature is sufficient to bend said substrate, such that said substrate surface is brought into an intimate conforming relationship with said pedestal surface, and such that voids between said substrate surface and cooling surface are minimized.

9. The apparatus of claim 8, wherein said substrate is a glass substrate.

10. The apparatus of claim 8, wherein said downwardly curving pedestal surface is a multiply stepped or beveled approximation of a smoothly curving surface.

11. The apparatus of claim 8, wherein said multiply stepped or beveled slope has a departure from a smoothly curving surface that is less than 10 mils (0.010 inches).

12. The apparatus of claim 8 wherein said substrate is cooled during processing under vacuum in a reaction chamber.

13. The apparatus of claim 8, wherein said rectangular substrate has a longer dimension and a shorter dimension, and wherein said longer dimension either runs parallel to said cooling surface center line or perpendicular to said line.

14. The apparatus of claim 8, wherein said coolant medium is an inert gas.

15. A method for cooling a rectangular glass substrate, comprising the steps of:

positioning said glass substrate with a substrate surface proximate to a rectangular pedestal having a convex cooling surface, said convex pedestal cooling surface curving downwardly from a pedestal center line, said downwardly curved pedestal surface being a multiply stepped or beveled slope that sufficiently approximates a smoothly curving surface, said pedestal cooling surface having a downward curvature that is greater than an amount of glass substrate bending which would result from the amount of pressure which is to be applied by an inert gas on said glass substrate surface; and bending said glass substrate, such that said glass substrate surface is brought into an intimate conforming relationship with said pedestal surface, and such that voids between said glass substrate surface and said cooling surface are minimized;and providing an inert gas under pressure between said glass substrate surface and said pedestal surface;

wherein said substrate is cooled during processing under vacuum in a reaction chamber.

16. The method of claim 15, wherein said rectangular substrate has a longer dimension and a shorter dimension, and wherein said longer dimension runs either parallel to said cooling surface center line or perpendicular to said center line.

17. An apparatus for cooling a rectangular glass substrate, comprising:

a rectangular pedestal having a convex cooling surface having a pedestal center line, said convex pedestal cooling surface curving downwardly from said pedestal center line, said downwardly curving pedestal surface being a multiply stepped or beveled approximation of a smoothly curving surface, said pedestal cooling surface having a downward curvature that is greater than an amount of glass substrate bending which would result from the amount of pressure which is to be applied by an inert gas on said glass substrate surface;

means for positioning said glass substrate at a substrate surface proximate to said cooling surface thereby conforming said glass substrate to said cooling surface, said downward curvature being sufficient to bend said glass substrate, wherein said glass substrate surface is brought into an intimate conforming relationship with said pedestal surface, such that voids between said glass substrate surface and said cooling surface are minimized; and an inert gas provided under pressure to said glass substrate surface;

wherein said glass substrate is cooled during processing under vacuum in a reaction chamber.

18. The apparatus of claim 17, wherein said rectangular substrate has a longer dimension and a shorter dimension, and wherein said longer dimension runs either parallel to said cooling surface center line or perpendicular to said center line.

19. A method for cooling a rectangular glass substrate, comprising the steps of:

positioning said glass substrate with a substrate surface proximate to a rectangular pedestal having a convex cooling surface, said convex pedestal cooling surface curving downwardly from a pedestal center line, said downwardly curved pedestal surface being a multiply stepped or beveled slope that sufficiently approximates a smoothly curving surface, said pedestal cooling surface having a downward curvature that is greater than an amount of glass substrate bending which would result from the amount of pressure which is to be applied by an inert gas on said glass substrate surface, said rectangular substrate having a longer dimension and a shorter dimension, said longer dimension running either parallel to said cooling surface center line or perpendicular to said center line;

bending said glass substrate, such that said glass substrate surface is brought into an intimate conforming relationship with said pedestal surface, and such that voids between said glass substrate surface and said cooling surface are minimized; and providing an inert gas under pressure between said glass substrate surface and said pedestal surface;

wherein said substrate is cooled during processing under vacuum in a reaction chamber.

20. An apparatus for cooling a rectangular glass substrate, comprising:

a rectangular pedestal having a convex cooling surface having a pedestal center line, said convex pedestal cooling surface curving downwardly from said pedestal center line, said downwardly curving pedestal surface being a multiply stepped or beveled approximation of a smoothly curving surface, said pedestal cooling surface having a downward curvature that is greater than an amount of glass substrate bending which would result from the amount of pressure which is to be applied by an inert gas on said glass substrate surface, said rectangular substrate having a longer dimension that runs either parallel to said cooling surface center line or perpendicular to said center line;

means for positioning said glass substrate at a substrate surface proximate to said cooling surface thereby conforming said glass substrate to said cooling surface, said downward curvature being sufficient to bend said glass substrate, wherein said glass substrate surface is brought into an intimate conforming relationship with said pedestal surface, such that voids between said glass substrate surface and said cooling surface are minimized; and an inert gas provided under pressure to said glass substrate surface;

wherein said glass substrate is cooled during processing under vacuum in a reaction chamber.

* * * * *